US012713794B2

(12) United States Patent
Lee et al.

(10) Patent No.: US 12,713,794 B2
(45) Date of Patent: Aug. 18, 2026

(54) DISPLAY DEVICE AND METHOD OF MANUFACTURING THE SAME

(71) Applicant: Samsung Display Co., LTD., Yongin-si (KR)

(72) Inventors: Seung Min Lee, Yongin-si (KR); Dong Jo Kim, Yongin-si (KR); Young Ji Kim, Yongin-si (KR); Hyun Kim, Yongin-si (KR); Si Joon Song, Yongin-si (KR); Je Won Yoo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 393 days.

(21) Appl. No.: 18/511,349

(22) Filed: Nov. 16, 2023

(65) Prior Publication Data

US 2024/0341138 A1 Oct. 10, 2024

(30) Foreign Application Priority Data

Apr. 10, 2023 (KR) ........................ 10-2023-0047133

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/871* (2023.02); *H10K 59/873* (2023.02); *H10K 71/60* (2023.02)

(58) Field of Classification Search
CPC ............. H10K 59/1201; H10K 59/871; H10K 59/873; H10K 71/60; H10K 77/10; H10K 59/1213; H10K 59/122; H10K 59/123; H10K 77/111; H10K 2102/311; H10K 59/40; H10K 59/82; H10K 59/65; H10K 59/131–1315; H10K 59/1275; H10K 59/10–221; H10W 72/019; H10W 70/688; H05B 33/0896
See application file for complete search history.

(56) References Cited

U.S. PATENT DOCUMENTS 10,504,931 B2 * 12/2019 Zhou .................... H10D 86/441
11,189,648 B2 * 11/2021 Li ........................ H10D 86/441
(Continued)

FOREIGN PATENT DOCUMENTS

EP 3955291 A1 2/2022
KR 10-2023-0168613 A 12/2023
(Continued)

*Primary Examiner* — Maliheh Malek
(74) *Attorney, Agent, or Firm* — Womble Bond Dickinson (US) LLP

(57) ABSTRACT

A display device includes: a substrate comprising an open portion; a pad portion on the substrate and exposed through the open portion; a fanout line integrally formed with the pad portion; a data line electrically connected to the fanout line; a flexible film under the substrate and comprising a lead electrode inserted into the open portion of the substrate to directly contact the pad portion; and a contact portion covering a lower surface of the lead electrode and a lower surface of the pad portion to electrically connect the lead electrode and the pad portion.

20 Claims, 13 Drawing Sheets

(51) Int. Cl.
*H10K 59/80* (2023.01)
*H10K 71/60* (2023.01)

(56) References Cited

U.S. PATENT DOCUMENTS 11,989,481 B2 * 5/2024 Lee ........................ G06F 3/1446
12,009,463 B2 * 6/2024 Zhu ...................... H10H 20/857
12,310,171 B2 * 5/2025 Kishimoto ........... H10K 59/131
12,336,287 B2 * 6/2025 Jang ....................... H10D 86/60
12,354,562 B2 * 7/2025 Son ...................... G09G 3/3291
12,382,770 B2 * 8/2025 Cha ...................... H10H 29/142
12,433,023 B2 * 9/2025 Park ....................... H10D 86/60
12,457,805 B2 * 10/2025 Kwon .................... H10D 86/60
12,513,992 B2 * 12/2025 Park ....................... H10D 86/60
2006/0066788 A1 * 3/2006 Utsumi ............. G02F 1/133509 349/120
2008/0137016 A1 * 6/2008 Kim .................... G02F 1/13452 326/82
2009/0134782 A1 * 5/2009 Kim ..................... H10K 59/131 313/504
2009/0194770 A1 * 8/2009 Liu .................... H10D 86/0251 257/E33.003
2009/0246939 A1 * 10/2009 Azuma ............... H10P 14/3411 257/E21.318
2011/0253987 A1 * 10/2011 Chung ................ H10P 14/3806 257/66
2014/0332898 A1 * 11/2014 Du ....................... H10D 86/441 257/386
2016/0005804 A1 * 1/2016 Oh ..................... H10K 59/1213 438/239
2016/0351539 A1 * 12/2016 Bower .................. H10W 90/00
2017/0102797 A1 * 4/2017 Cok .................... G02F 1/13338
2017/0179159 A1 * 6/2017 Kawata ................ H10D 86/441
2017/0323910 A1 * 11/2017 Park ..................... H10D 86/481
2017/0338246 A1 * 11/2017 Kubota ................ H10D 86/441
2018/0138260 A1 * 5/2018 Kajiyama .............. H10K 77/10
2019/0035820 A1 * 1/2019 Yanaka ................ H10D 86/423
2020/0135811 A1 * 4/2020 Jung ...................... H10K 59/38
2020/0211929 A1 * 7/2020 Son ....................... G09F 9/3026
2021/0376040 A1 * 12/2021 Youn .................. H10K 59/1315
2022/0052078 A1 * 2/2022 Kim ...................... H10W 90/00
2022/0052079 A1 * 2/2022 Jang ....................... H10D 86/60
2022/0077195 A1 * 3/2022 Jeong ................. H10D 86/0214
2022/0093677 A1 * 3/2022 Jeong ................... H10H 29/142
2022/0093881 A1 * 3/2022 Yueh .................... H10K 77/111
2022/0093883 A1 * 3/2022 Jian ........................ H10K 85/40
2022/0102468 A1 3/2022 Lee et al.
2022/0208850 A1 * 6/2022 Im .......................... H10H 20/01
2022/0285598 A1 * 9/2022 Lee ...................... H10K 59/131
2022/0293636 A1 * 9/2022 Lee ........................ H10D 86/60
2022/0328436 A1 * 10/2022 Song .................... H10D 86/441
2022/0328724 A1 * 10/2022 Jang ..................... H10H 20/831
2022/0384492 A1 * 12/2022 Lu ........................ H10D 86/411
2022/0392990 A1 * 12/2022 Shin ..................... H10K 59/131
2023/0033837 A1 * 2/2023 Cha ...................... H10H 29/142
2023/0136160 A1 * 5/2023 Zhu ...................... H10H 20/857 257/79
2023/0143994 A1 * 5/2023 Kim ....................... H10K 59/18 257/40
2023/0187582 A1 * 6/2023 Noh ................... H10H 20/8312 257/79
2023/0275103 A1 * 8/2023 Kim ....................... H10D 86/60
2023/0275188 A1 * 8/2023 Lee ....................... G09F 9/3026
2023/0282173 A1 * 9/2023 Son ...................... G09G 3/3291
2023/0282650 A1 * 9/2023 Jang ...................... G06F 3/1446
2023/0307462 A1 * 9/2023 Kwon .................... H10D 86/60
2023/0315376 A1 * 10/2023 Lee ...................... G06F 3/1446 345/1.3
2023/0397461 A1 12/2023 Kang
2024/0105897 A1 * 3/2024 Choi .................... H10H 20/857
2024/0122009 A1 * 4/2024 Choi .................... H10K 59/131
2024/0153966 A1 * 5/2024 Choi ...................... H10D 86/60
2024/0155926 A1 * 5/2024 Lee .................... H10K 59/8792
2024/0170500 A1 * 5/2024 Xu ....................... H10D 86/443
2024/0179974 A1 5/2024 Lee et al.
2024/0215377 A1 6/2024 Kim et al.
2024/0244905 A1 7/2024 Lee et al.
2024/0414963 A1 12/2024 Lee et al.
2025/0024719 A1 1/2025 Lee et al.
2025/0040371 A1 * 1/2025 Lee ...................... H10K 77/111
2025/0048861 A1 * 2/2025 Song .................... H10K 59/127
2025/0072272 A1 * 2/2025 Sun ...................... G09G 3/3208
2025/0098456 A1 * 3/2025 Lee ...................... H10K 59/131
2025/0098514 A1 * 3/2025 Kim ..................... H10K 59/124
2025/0107360 A1 * 3/2025 Lee ...................... H10K 59/131
2025/0374677 A1 * 12/2025 Kim ..................... H10D 86/441
2026/0047286 A1 * 2/2026 Yu ........................ H10K 59/131

FOREIGN PATENT DOCUMENTS

KR 10-2024-0015230 A 2/2024
KR 10-2024-0080306 A 6/2024
KR 10-2024-0103163 A 7/2024
KR 10-2024-0115377 A 7/2024
KR 10-2025-0010198 A 1/2025

* cited by examiner

MTL1: PAD, FOL
ACTL: DE, ACT, SE
MTL2: GE
MTL3: CWL, DL, VL, CNE
MTL4: AE
MTL5: CE

FIG. 11

DISPLAY DEVICE AND METHOD OF MANUFACTURING THE SAME

CROSS-REFERENCE TO RELATED APPLICATION

The present application claims priority to and the benefit of Korean Patent Application No. 10-2023-0047133, filed on Apr. 10, 2023, in the Korean Intellectual Property Office, the entire disclosure of which is incorporated herein by reference.

BACKGROUND

1. Field

Aspects of some embodiments of the present disclosure relate to a display device and a method of manufacturing the same.

2. Description of the Related Art

As the information society develops, consumer demand for display devices for displaying images is increasing in various forms. For example, display devices are applied to various electronic devices such as smartphones, digital cameras, notebook computers, navigation devices, and smart televisions. The display devices may be flat panel display devices such as liquid crystal display devices, field emission display devices, and organic light emitting display devices. Among these flat panel display devices, a light emitting display device includes a light emitting element that enables each pixel of a display panel to emit light by itself. Thus, the light emitting display device can display images without a backlight unit that provides light to the display panel.

The above information disclosed in this Background section is only for enhancement of understanding of the background and therefore the information discussed in this Background section does not necessarily constitute prior art.

SUMMARY

Aspects of some embodiments of the present disclosure include a display device which can reduce manufacturing time and cost by minimizing or reducing the area of a non-display area and simplifying a manufacturing process and a method of manufacturing the display device.

However, aspects of embodiments according to the present disclosure are not restricted to those set forth herein. The above and other aspects of embodiments according to the present disclosure will become more apparent to one of ordinary skill in the art to which the present disclosure pertains by referencing the detailed description of the present disclosure given below.

According to some embodiments, a display device comprises a substrate comprising an open portion, a pad portion on the substrate and exposed through the open portion, a fanout line integrally formed with the pad portion, a data line electrically connected to the fanout line, a flexible film under the substrate and comprising a lead electrode inserted into the open portion of the substrate to directly contact the pad portion, and a contact portion covering a lower surface of the lead electrode and a lower surface of the pad portion to electrically connect the lead electrode and the pad portion.

According to some embodiments, the lead electrode may protrude from a side of the flexible film, and the contact portion may cover the lower surface of the lead electrode protruding from the flexible film.

According to some embodiments, the display device may further comprise an etch stop layer between the substrate and the fanout line and exposing the pad portion to the open portion.

According to some embodiments, the etch stop layer may include at least one of polyimide (PI), silicon nitride (SiNx), or silicon (Si).

According to some embodiments, the substrate may comprise a first side surface surrounding the open portion of the substrate and adjacent to a lower surface of the substrate, and a second side surface between the first side surface and an upper surface of the substrate.

According to some embodiments, the first side surface of the substrate may be inclined at 40 to 60 degrees to the lower surface of the substrate, and the second side surface of the substrate may be inclined at less than 15 degrees to the upper surface of the substrate.

According to some embodiments, a planar length of the second side surface may be smaller than a thickness of the substrate.

According to some embodiments, the contact portion may be formed using a metal paste including silver (Ag) or copper (Cu).

According to some embodiments, the display device may further comprise a display area displaying an image and a non-display area surrounding the display area. The pad portion and the flexible film may be in the display area.

According to some embodiments, the display device may further comprise a transistor layer comprising a transistor electrically connected to the data line, a light emitting element layer on the transistor layer and comprising a light emitting element, and an encapsulation layer covering upper and side surfaces of the light emitting element layer.

According to some embodiments, the display device may further comprise a transistor layer comprising a transistor electrically connected to the data line, a light emitting element layer on the transistor layer and comprising a light emitting element, an encapsulation substrate on the light emitting element layer, and a sealing portion provided between the substrate and the encapsulation substrate along edges of the substrate and the encapsulation substrate to bond the substrate and the encapsulation substrate together.

According to some embodiments, a display device comprises a substrate comprising an open portion, an etch stop layer on the substrate and comprising a contact hole overlapping the open portion, a pad portion on the etch stop layer and inserted into the contact hole of the etch stop layer, a fanout line integrally formed with the pad portion, a transistor electrically connected to the fanout line, a flexible film under the substrate and inserted into the open portion of the substrate, and a lead electrode comprising a portion, which protrudes from a side of the flexible film and does not overlap the flexible film, and directly contacting the pad portion.

According to some embodiments, the display device may further comprise a contact portion covering the portion of the lead electrode, which does not overlap the flexible film, and a surface of the pad portion to electrically connect the lead electrode and the pad portion.

According to some embodiments, the contact portion may be formed using a metal paste including silver (Ag) or copper (Cu).

According to some embodiments, the substrate may comprise a first side surface surrounding the open portion of the substrate and adjacent to a lower surface of the substrate, and a second side surface between the first side surface and an upper surface of the substrate.

According to some embodiments, the first side surface of the substrate may be inclined at 40 to 60 degrees to the lower surface of the substrate, and the second side surface of the substrate may be inclined at less than 15 degrees to the upper surface of the substrate.

According to some embodiments, a method of manufacturing a display device comprises providing a substrate, forming an etch stop layer, which comprises a contact hole, on the substrate, forming a pad portion which is inserted into the contact hole of the etch stop layer, forming a fanout line which is formed integrally with the pad portion and on the etch stop layer, forming an open portion to expose the pad portion by etching a lower portion of the substrate, bringing a lead electrode of a flexible film into direct contact with the pad portion by inserting a side of the flexible film into the open portion, and forming a contact portion which electrically connects the pad portion and the lead electrode by covering a portion of the pad portion and a portion of the lead electrode.

According to some embodiments, the forming of the contact portion may comprise printing a metal paste on the open portion of the substrate and sintering the metal paste.

According to some embodiments, the forming of the contact portion may further comprise separating the sintered metal paste into a plurality of contact portions through a laser patterning process.

According to some embodiments, the forming of the open portion of the substrate may comprise forming a first side surface which surrounds the open portion of the substrate and is adjacent to a lower surface of the substrate, and forming a second side surface between the first side surface and an upper surface of the substrate by undercutting the first side surface.

BRIEF DESCRIPTION OF THE DRAWINGS

These and/or other aspects will become more apparent and more readily appreciated from the following description of the embodiments, taken in conjunction with the accompanying drawings in which:

FIGS. 10 through 13 are cross-sectional views illustrating a process of manufacturing a display device according to some embodiments.

DETAILED DESCRIPTION

Figure 1:
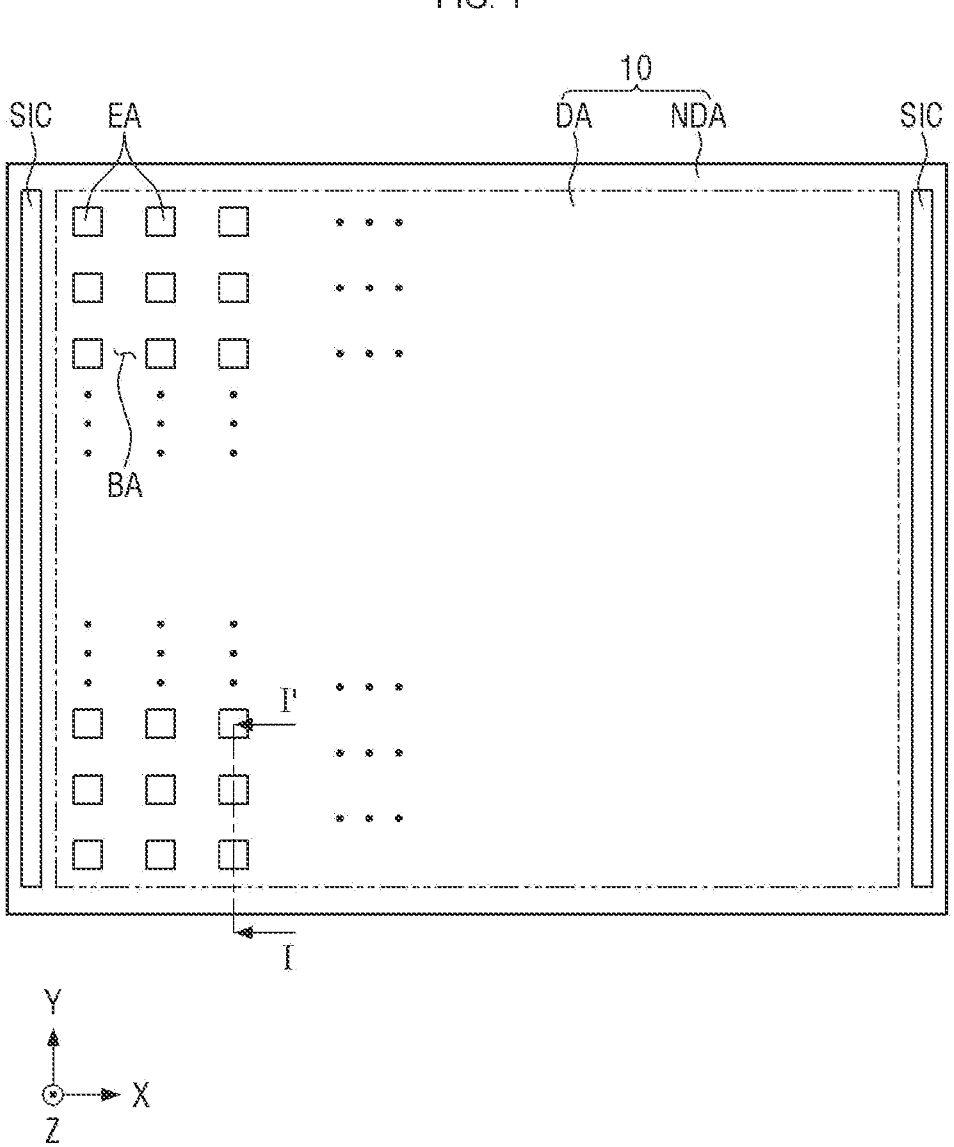
FIG. 1 is a plan view of a display device according to some embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting embodiments of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of some embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or features, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, or Z" and "at least one selected from the group consisting of X, Y, and Z" may be construed as X only, Y only, Z only, or any combination of two or more of X, Y, and/or Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to cross-sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, aspects of some embodiments according to the present disclosure are described with reference to the accompanying drawings.

FIG. 1 is a plan view of a display device 10 according to some embodiments.

Referring to FIG. 1, the display device 10 may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). Alternatively, the display device 10 may be applied as a display unit of a television, a notebook computer, a monitor, a billboard, or an Internet of things (IoT) device. Alternatively, the display device 10 may be applied to wearable devices such as smart watches, watch phones, glass-like displays, and head-mounted displays (HMDs). Embodiments according to the present disclosure, however, are not limited to the electronic devices listed above, and the display device 10 may be utilized or incorporated into any suitable electronic device configured to graphically display images.

The display device 10 may have a planar shape similar to a quadrangle. For example, in the display device 10, each corner where a side extending in an X-axis direction meets a side extending in a Y-axis direction may be rounded with a predetermined curvature or may be right-angled. The planar shape of the display device 10 is not limited to the quadrangular shape but may also be similar to other polygonal shapes, a circular shape, or an oval shape.

The display device 10 may include a display area DA and a non-display area NDA. The display area DA may include a plurality of pixels to display images. Each of the pixels may include an organic light emitting diode including an organic light emitting layer, a quantum dot light emitting diode including a quantum dot light emitting layer, an inorganic light emitting diode including an inorganic semiconductor, or a micro-light emitting diode. A case where each of the pixels includes an organic light emitting diode will be mainly described below, but embodiments according to the present disclosure are not limited thereto.

The pixels may be arranged along a plurality of rows and a plurality of columns in the display area DA. Each of the pixels may include an emission area EA defined by a pixel defining layer or a bank and may emit light having a predetermined peak wavelength through the emission area EA. The emission area EA may be an area in which light generated by a light emitting element of the display device 10 is emitted to the outside of the display device 10.

The display area DA of the display device 10 may include a light blocking area BA surrounding the emission areas EA. The light blocking area BA may prevent or reduce color mixing of light emitted from the emission areas EA.

The non-display area NDA may be arranged around (e.g., in a periphery or outside a footprint of) the display area DA to surround the display area DA and may not display images. The non-display area NDA may include a scan driver SIC for supplying scan signals to the display area DA. The scan driver SIC may be located on left and right sides of the non-display area NDA. The scan driver SIC may generate scan signals based on a scan control signal. The scan control signal may include a start signal, a clock signal, and a power supply voltage, but embodiments according to the present disclosure are not limited thereto. The scan driver SIC may supply the scan signals to scan lines of the display area DA in a set order.

Figure 2:
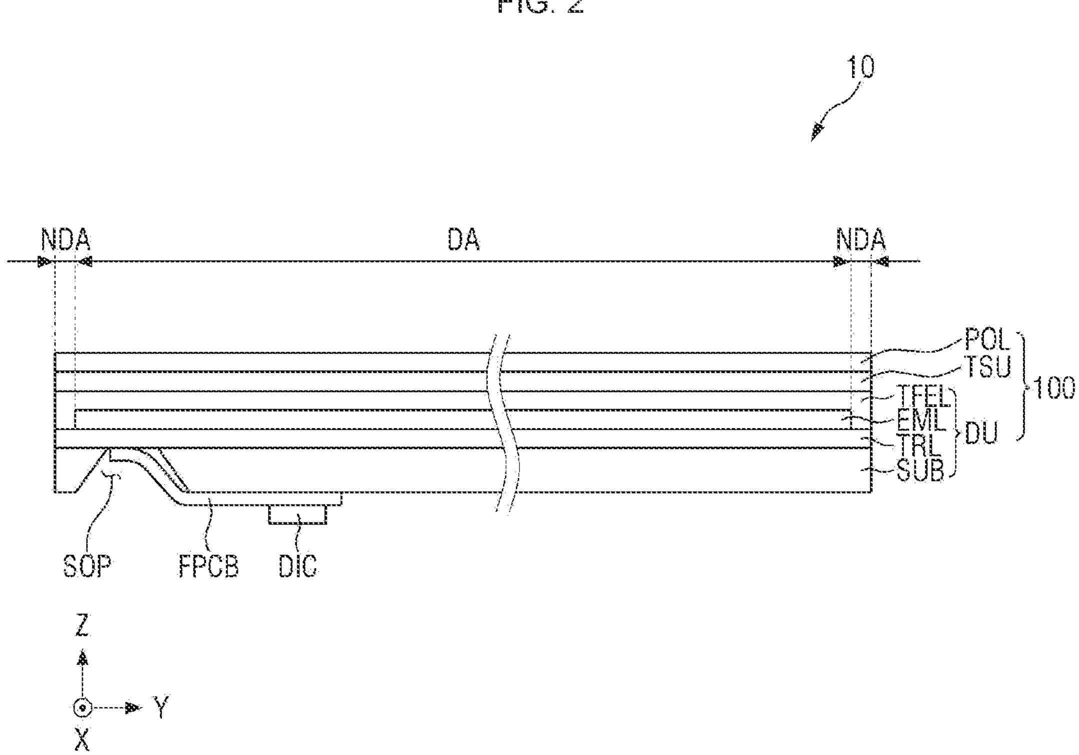
FIG. 2 is a cross-sectional view of the display device according to some embodiments.

FIG. 2 is a cross-sectional view of the display device 10 according to some embodiments.

Referring to FIG. 2, a display panel 100 may include a display unit DU, a touch sensing unit TSU, and a polarizing film POL. The display unit DU may include a substrate SUB, a transistor layer TRL, a light emitting element layer EML, and an encapsulation layer TFEL.

The substrate SUB may be a base substrate or a base member. For example, the substrate SUB may be a rigid substrate including a glass material or a metal material, but embodiments according to the present disclosure are not limited thereto. For another example, the substrate SUB may be a flexible substrate including polymer resin such as polyimide (PI).

The transistor layer TRL may be located on the substrate SUB. The transistor layer TRL may include a plurality of transistors constituting pixel circuits of pixels. The transistor layer TRL may include scan lines, data lines, and power lines connected to the pixels. Each of the transistors may include a semiconductor region, a source electrode, a drain electrode, and a gate electrode. For example, when the scan driver is formed on a side of the non-display area NDA of the display panel 100, it may include transistors.

The transistor layer TRL may be located in the display area DA and the non-display area NDA. The transistors, scan lines, data lines, and power lines of the pixels of the transistor layer TRL may be located in the display area DA. The transistors of the scan driver SIC may be located in the non-display area NDA.

The light emitting element layer EML may be located on the transistor layer TRL. The light emitting element layer EML may include a plurality of light emitting elements, each emitting light by including a pixel electrode, a light emitting layer and a common electrode stacked sequentially, and a pixel defining layer defining the pixels. The light emitting elements of the light emitting element layer EML may be located in the display area DA.

For example, the light emitting layer may be an organic light emitting layer including an organic material. The light emitting layer may include a hole transporting layer, an organic light emitting layer, and an electron transporting layer. When the pixel electrode receives a voltage (e.g., a set or predetermined voltage) through a transistor of the transistor layer TRL and the common electrode receives a cathode voltage, holes may move to the organic light emitting layer through the hole transporting layer, and electrons may move to the organic light emitting layer through the electron transporting layer. Accordingly, the holes and the electrons may combine in the organic light emitting layer to emit light. For example, the pixel electrode may be an anode, and the common electrode may be a cathode, but embodiments according to the present disclosure are not limited thereto.

For another example, each of the light emitting elements may include a quantum dot light emitting diode including a quantum dot light emitting layer, an inorganic light emitting diode including an inorganic semiconductor, or a micro-light emitting diode.

The encapsulation layer TFEL may cover upper and side surfaces of the light emitting element layer EML and may protect the light emitting element layer EML. The encapsulation layer TFEL may include at least one inorganic layer and at least one organic layer to encapsulate the light emitting element layer EML.

The touch sensing unit TSU may be located on the encapsulation layer TFEL. The touch sensing unit TSU may include a plurality of touch electrodes for sensing a user's touch in a capacitive manner and touch lines for supplying touch driving signals to the touch electrodes. For example, the touch sensing unit TSU may sense a user's touch using a mutual capacitance method or a self-capacitance method.

The touch electrodes of the touch sensing unit TSU may be located in a touch sensor area overlapping the display area DA. The touch lines of the touch sensing unit TSU may be located in a touch peripheral area overlapping the non-display area NDA.

The polarizing film POL may be located on the touch sensing unit TSU. The polarizing film POL may be attached onto the touch sensing unit TSU by an optically clear adhesive (OCA) film or an optically clear resin (OCR). For example, the polarizing film POL may include a linear polarizer and a phase retardation film, and the phase retardation film may be a quarter-wave ($\lambda/4$) plate. The phase retardation film and the linear polarizer may be sequentially stacked on the touch sensing unit TSU. The polarizing film POL may prevent or reduce color distortion caused by reflection of external light by reducing reflected light due to the external light.

The substrate SUB may include a cavity or open portion SOP. The open portion SOP of the substrate SUB may be etched from a lower surface of the substrate SUB to an upper surface of the substrate SUB. For example, a lower width of the open portion SOP may be greater than an upper width of the open portion SOP. That is, the open portion SOP may have tapered edges from a bottom of the substrate SUB to the top of the substrate SUB. During a process of manufacturing the display device 10, a pad portion provided in the transistor layer TRL may be exposed by the open portion SOP of the substrate SUB. The pad portion may be electrically connected to a display driver DIC through a flexible film FPCB inserted into the open portion SOP.

The flexible film FPCB may be located under the substrate SUB. A portion of the flexible film FPCB may be inserted into the open portion SOP of the substrate SUB and electrically connected to the pad portion, and another portion of the flexible film FPCB may be attached to the lower surface of the substrate SUB. The flexible film FPCB may support the display driver DIC. The flexible film FPCB may transmit signals and voltages of the display driver DIC to the transistor layer TRL. The flexible film FPCB may supply a scan control signal to the scan driver SIC.

The display driver DIC may be mounted on the flexible film FPCB. The display driver DIC may be an integrated circuit. The display driver DIC may convert digital video data into analog data voltages based on a data control signal received from a timing controller and may supply the analog data voltages to the data lines of the display area DA through the flexible film FPCB. The display driver DIC may supply a power supply voltage received from a power supply unit to the power lines of the display area DA through the flexible film FPCB. Because the display device 10 includes the flexible film FPCB and the display driver DIC located under the substrate SUB in the display area DA, the area of the non-display area NDA can be minimized or reduced.

Figure 3:
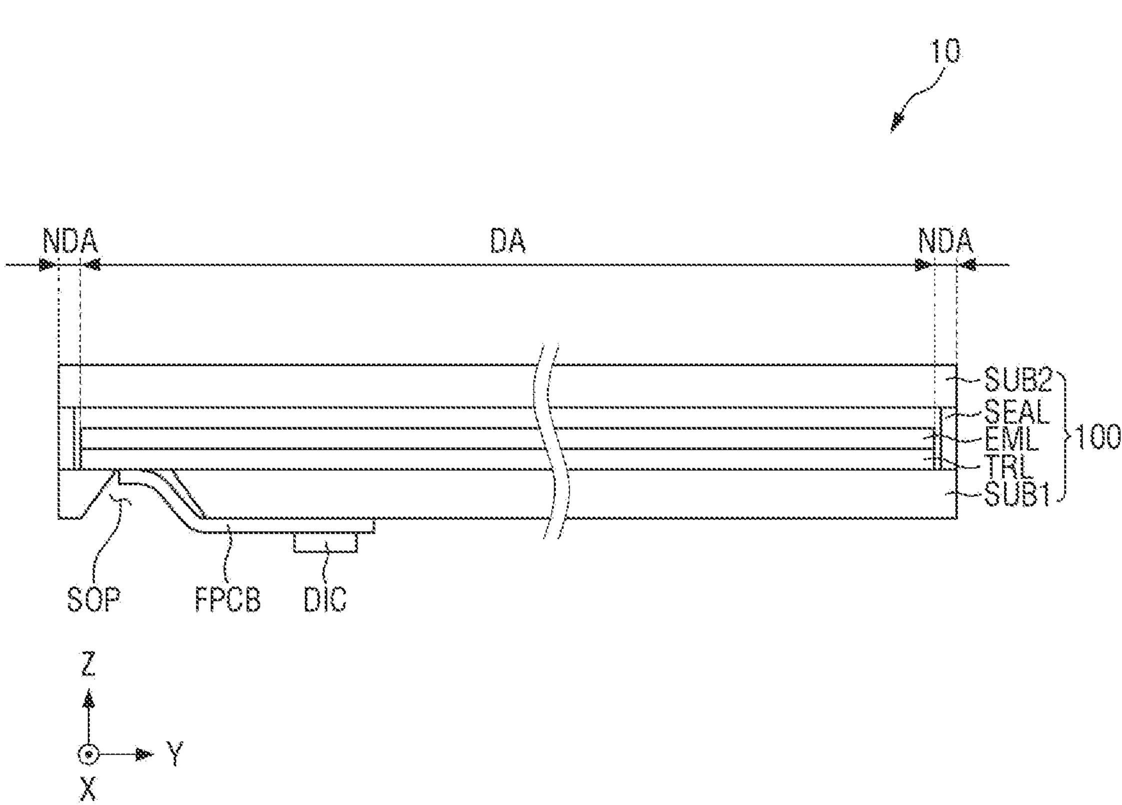
FIG. 3 is a cross-sectional view of a display device according to some embodiments.

FIG. 3 is a cross-sectional view of a display device 10 according to some embodiments.

Referring to FIG. 3, a display panel 100 may include a first substrate SUB1, a transistor layer TRL, a light emitting element layer EML, a sealing portion SEAL, and a second substrate SUB2.

The first substrate SUB1 may be a base substrate or a base member. For example, the first substrate SUB1 may be a rigid substrate including a glass material or a metal material, but embodiments according to the present disclosure are not limited thereto. For another example, the first substrate SUB1 may be a flexible substrate including polymer resin such as polyimide (PI).

The transistor layer TRL may be located on the first substrate SUB1 in a display area DA. The transistor layer TRL may include a plurality of transistors constituting pixel circuits of pixels. The transistor layer TRL may include scan lines, data lines, and power lines connected to the pixels. Each of the transistors may include a semiconductor region, a source electrode, a drain electrode, and a gate electrode.

The light emitting element layer EML may be located on the transistor layer TRL. The light emitting element layer EML may include a plurality of light emitting elements, each emitting light by including a pixel electrode, a light emitting layer and a common electrode stacked sequentially, and a pixel defining layer defining the pixels. The light emitting elements of the light emitting element layer EML may be located in the display area DA.

The sealing portion SEAL may be located between the first substrate SUB1 and the second substrate SUB2. The sealing portion SEAL may be provided along edges of a non-display area NDA and may bond the first and second substrates SUB1 and SUB2 together. The sealing portion SEAL may protect side surfaces of the display panel 100.

The second substrate SUB2 may be located in an upper part of the display panel 100 to protect the transistor layer TRL and the light emitting element layer EML. The second substrate SUB2 may be an encapsulation substrate for encapsulating the transistor layer TRL and the light emitting element layer EML. For example, the second substrate SUB2 may include a glass material or a metal material, but embodiments according to the present disclosure are not limited thereto.

The first substrate SUB1 may include an open portion SOP. The open portion SOP of the first substrate SUB1 may be etched from a lower surface of the first substrate SUB1 to an upper surface of the first substrate SUB1. For example, a lower width of the open portion SOP may be greater than an upper width of the open portion SOP. During a process of manufacturing the display device 10, a pad portion provided in the transistor layer TRL may be exposed by the open portion SOP of the first substrate SUB1. The pad portion may be electrically connected to a display driver DIC through a flexible film FPCB inserted into the open portion SOP.

The flexible film FPCB may be located under the first substrate SUB1. A portion of the flexible film FPCB may be inserted into the open portion SOP of the first substrate SUB1 and electrically connected to the pad portion, and another portion of the flexible film FPCB may be attached to the lower surface of the first substrate SUB1.

The flexible film FPCB may support the display driver DIC. The flexible film FPCB may transmit signals and voltages of the display driver DIC to the transistor layer TRL.

The display driver DIC may be mounted on the flexible film FPCB. The display driver DIC may be an integrated circuit. The display driver DIC may convert digital video data into analog data voltages based on a data control signal received from a timing controller and may supply the analog data voltages to the data lines of the display area DA through the flexible film FPCB. The display driver DIC may supply a power supply voltage received from a power supply unit to the power lines of the display area DA through the flexible film FPCB. Because the display device 10 includes the flexible film FPCB and the display driver DIC located under the first substrate SUB1 in the display area DA, the area of the non-display area NDA can be minimized or reduced.

Figure 4:
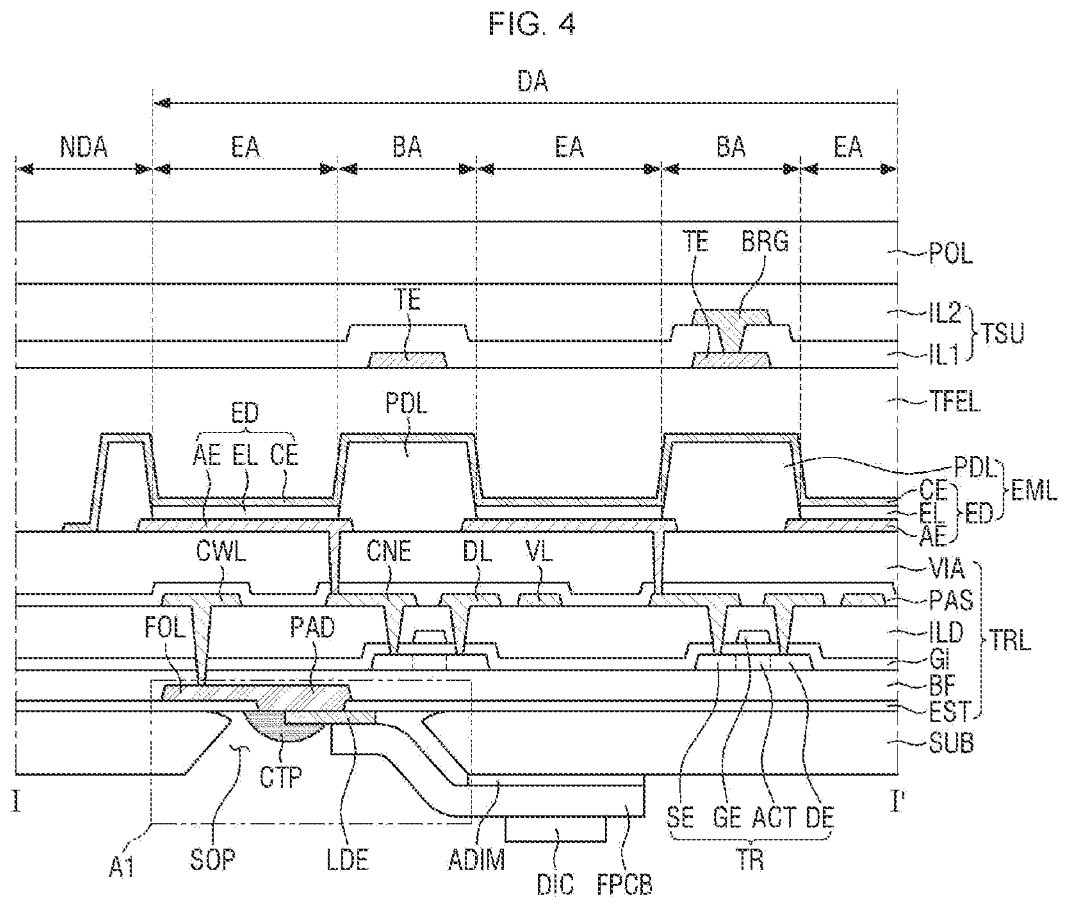
FIG. 4 is a cross-sectional view taken along the line I-I' of FIG. 1 according to some embodiments.
Figure 5:
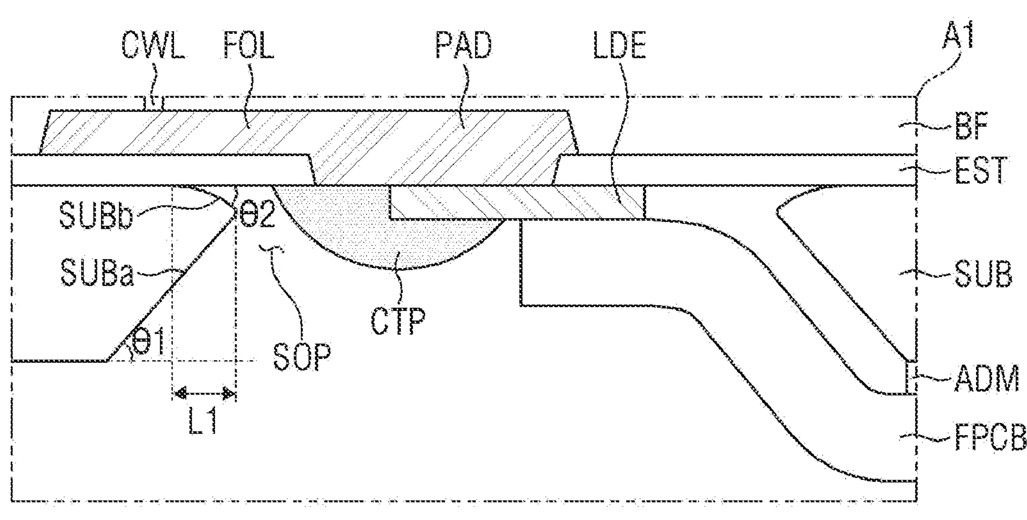
FIG. 5 is an enlarged view of the area A1 of FIG. 4 according to some embodiments.

FIG. 4 is a cross-sectional view taken along line I-I' of FIG. 1, and FIG. 5 is an enlarged view of area A1 of FIG. 4.

Referring to FIGS. 4 and 5, the display area DA of the display device 10 may include a plurality of emission areas EA. Each of the emission areas EA may be an area in which light generated by a light emitting element ED is emitted to the outside of the display device 10.

The display device 10 includes the substrate SUB, the transistor layer TRL, the light emitting element layer EML, the encapsulation layer TFEL, the touch sensing unit TSU, the polarizing film POL, the flexible film FPCB, and the display driver DIC.

The substrate SUB may support the display device 10. The substrate SUB may be a base substrate or a base member. For example, the substrate SUB may be a rigid substrate including a glass material or a metal material, but embodiments according to the present disclosure are not limited thereto. For another example, the substrate SUB may be a flexible substrate including polymer resin such as polyimide (PI).

The substrate SUB may include the open portion SOP. The open portion SOP of the substrate SUB may be etched from the lower surface of the substrate SUB to the upper surface of the substrate SUB. For example, the lower width of the open portion SOP may be greater than the upper width of the open portion SOP. During the process of manufacturing the display device 10, a pad portion PAD may be exposed by the open portion SOP of the substrate SUB. The pad portion PAD may be electrically connected to the display driver DIC through the flexible film FPCB inserted into the open portion SOP.

In FIG. 5, a first side surface SUBa and a second side surface SUBb of the substrate SUB may be formed in the etching process for forming the open portion SOP of the substrate SUB. The first side surface SUBa and the second side surface SUBb of the substrate SUB may surround the open portion SOP. In the etching process from the lower surface of the substrate SUB, the second side surface SUBb of the substrate SUB may be formed by undercutting the first side surface SUBa. The first side surface SUBa of the substrate SUB may be adjacent to the lower surface of the substrate SUB, and the second side surface SUBb of the substrate SUB may be adjacent to the upper surface of the substrate SUB. The second side surface SUBb of the substrate SUB may be located between the first side surface SUBa and the upper surface of the substrate SUB. The first side surface SUBa of the substrate SUB may be inclined at a first angle θ1 to the lower surface of the substrate SUB, and the second side surface SUBb of the substrate SUB may be inclined at a second angle θ2 to the upper surface of the substate SUB.

The first angle θ1 of the first side surface SUBa may be greater than the second angle θ2 of the second side surface SUBb. For example, the first angle θ1 of the first side surface SUBa may be in a range of about 40 to 60 degrees, preferably, in a range of about 45 to 50 degrees. The second angle θ2 of the second side surface SUBb may be less than about 15 degrees.

A planar length L1 of the second side surface SUBb may be smaller than a thickness of the substrate SUB. For example, when the thickness of the substrate SUB is about 200 μm, the planar length L1 of the second side surface SUBb may be less than about 120 μm. The planar length L1 of the second side surface SUBb may be less than about 60% of the thickness of the substrate SUB.

The transistor layer TRL may be located on the substrate SUB. The transistor layer TRL may include an etch stop layer EST, a first metal layer MTL1, a buffer layer BF, an active layer ACTL, a gate insulating layer GI, a second metal layer MTL2, an interlayer insulating layer ILD, a third metal layer MTL3, a passivation layer PAS, and a via layer VIA.

The etch stop layer EST may be located on the substrate SUB. The etch stop layer EST may include a contact hole overlapping the open portion SOP of the substrate SUB. The etch stop layer EST may expose the pad portion PAD inserted into the contact hole and protect the transistor layer TRL during an etching process. Because the display device 10 includes the etch stop layer EST, the transistor layer TRL excluding the pad portion PAD can be protected even when the second side surface SUBb of the substrate SUB is formed by undercutting. Therefore, during the etching process of the substrate SUB, a fanout line FOL integrally formed with the pad portion PAD may be protected by the etch stop layer EST. For example, the etch stop layer EST may include polymer resin such as polyimide (PI) or an insulating material such as silicon nitride (SiNx) or silicon (Si), but embodiments according to the present disclosure are not limited thereto.

The first metal layer MTL1 may be located on the etch stop layer EST. The first metal layer MTL1 may include the pad portion PAD and the fanout line FOL. The first metal layer MTL1 may be a single layer or a multilayer including at least one of molybdenum (Mo), aluminum (Al), chromium (Cr), platinum (Pt), gold (Au), silver (Ag), titanium (Ti), nickel (Ni), palladium (Pd), indium (In), neodymium (Nd), tungsten (W), or copper (Cu).

The pad portion PAD may be integrally formed with the fanout line FOL and inserted into the contact hole provided in the etch stop layer EST. The pad portion PAD may electrically connect the flexible film FPCB and the fanout line FOL. The pad portion PAD may be exposed through the open portion SOP of the substrate SUB. A portion of the pad portion PAD may directly contact a lead electrode LDE of the flexible film FPCB, and another portion of the pad portion PAD may be electrically connected to the lead electrode LDE of the flexible film FPCB through a contact portion CTP.

The fanout line FOL may electrically connect the pad portion PAD and a connection portion CWL. The fanout line FOL may be electrically connected to a data line DL or a power line VL of the display area DA or the scan driver SIC of the non-display area NDA through the connection portion CWL. The data line DL and the power line VL of the display area DA may be electrically connected to a transistor TR, and the scan driver SIC may generate a scan signal. Therefore, the fanout line FOL may supply a data voltage or a power supply voltage received from the display driver DIC of the flexible film FPCB to the transistor TR of a pixel through the connection portion CWL and may supply a scan control signal received from the flexible film FPCB to the scan driver SIC through the connection portion CWL. Because the display device 10 includes the fanout line FOL located in the display area DA, the area of the non-display area NDA can be minimized or reduced.

The buffer layer BF may be located on the first metal layer MTL1 and the etch stop layer EST. The buffer layer BF may include an inorganic material that can prevent or reduce penetration of air or moisture. For example, the buffer layer BF may include a plurality of inorganic layers stacked alternately. The buffer layer BF may include a contact hole through which the connection portion CWL passes.

The active layer ACTL may be located on the buffer layer BF. The active layer ACTL may include a semiconductor region ACT, a drain electrode DE, and a source electrode SE of each transistor TR. The semiconductor region ACT may overlap a gate electrode GE in a thickness direction (Z-axis direction) and may be insulated from the gate electrode GE by the gate insulating layer GI. The drain electrode DE and the source electrode SE may be provided by making the material of the semiconductor region ACT conductive. The transistor TR may constitute a pixel circuit of each of a plurality of pixels.

The gate insulating layer GI may be located on the active layer ACTL and the buffer layer BF. The gate insulating layer GI may insulate the semiconductor region ACT and the gate electrode GE of each transistor TR from each other. The gate insulating layer GI may include contact holes through which the connection portion CWL, connection electrodes CNE, and data lines DL pass, respectively.

The second metal layer MTL2 may be located on the gate insulating layer GI. The second metal layer MTL2 may include the gate electrode GE of each transistor TR. The gate electrode GE may overlap the semiconductor region ACT with the gate insulating layer GI interposed between them. The gate electrode GE may receive a scan signal from a scan line. For example, the second metal layer MTL2 may be a single layer or a multilayer including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The interlayer insulating layer ILD may be located on the second metal layer MTL2. The interlayer insulating layer ILD may insulate the second and third metal layers MTL2 and MTL3 from each other. The interlayer insulating layer ILD may include contact holes through which the connection portion CWL, the connection electrodes CNE, and the data lines DL pass, respectively.

The third metal layer MTL3 may be located on the interlayer insulating layer ILD. The third metal layer MTL3 may include the connection portion CWL, the connection electrodes CNE, the data lines DL, and power lines VL. The connection portion CWL, the connection electrodes CNE, the data lines DL, and the power lines VL may be formed of the same material on the same layer. For example, the third metal layer MTL3 may be a single layer or a multilayer including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The connection portion CWL may be inserted into a contact hole penetrating the interlayer insulating layer ILD, the gate insulating layer GI and the buffer layer BF and thus may be connected to the fanout line FOL. For example, the connection portion CWL may be electrically connected to a data line DL to supply a data voltage to a transistor TR. The connection portion CWL may be electrically connected to a power line VL to supply a power supply voltage to the transistor TR. The connection portion CWL may be electrically connected to the scan driver SIC to supply a scan control signal to the scan driver SIC. Therefore, the connection portion CWL may supply a data voltage or a power supply voltage received from the display driver DIC to the transistor TR of a pixel through the fanout line FOL and may supply a scan control signal received from the flexible film FPCB to the scan driver SIC.

The connection electrodes CNE may electrically connect the source electrodes SE of the transistors TR and pixel electrodes AE of the light emitting elements ED. The connection electrodes CNE may be inserted into contact holes penetrating the interlayer insulating layer ILD and the gate insulating layer GI and thus may be connected to the source electrodes SE of the transistors TR. The connection electrodes CNE may supply driving currents received from the pixel circuits to the light emitting elements ED.

The data lines DL may extend in the Y-axis direction in the display area DA. The data lines DL may be inserted into contact holes penetrating the interlayer insulating layer ILD and the gate insulating layer GI and thus may be connected to the drain electrodes DE of the transistors TR. The data lines DL may supply data voltages to the transistors TR.

The power lines VL may extend in the Y-axis direction in the display area DA. The power lines VL may be electrically connected to the transistors TR or the light emitting elements ED. For example, the power lines VL may be high potential lines, low potential lines, or sensing lines, but embodiments according to the present disclosure are not limited thereto.

The passivation layer PAS may be located on the third metal layer MTL3 and the interlayer insulating layer ILD. The passivation layer PAS may protect the transistors TR. The passivation layer PAS may include contact holes through which the pixel electrodes AE pass.

The via layer VIA may be located on the passivation layer PAS. The via layer VIA may planarize an upper end of the transistor layer TRL. The via layer VIA may include an organic insulating material such as polyimide (PI). The via layer VIA may include contact holes through which the pixel electrodes AE pass.

The light emitting element layer EML may be located on the transistor layer TRL. The light emitting element layer EML may include the light emitting elements ED and a pixel defining layer PDL.

The light emitting elements ED may be located on the via layer VIA in the emission areas EA. The light emitting element ED of each of the pixels may include the pixel electrode AE, a light emitting layer EL, and a common electrode CE. The pixel electrode AE may be located on the via layer VIA. The pixel electrode AE may overlap one of the emission areas EA defined by the pixel defining layer PDL. For example, the pixel electrode AE may receive a driving current from a pixel circuit through a connection electrode CNE.

The light emitting layer EL may be located on the pixel electrode AE. For example, the light emitting layer EL may be, but is not limited to, an organic light emitting layer made of an organic material. When the light emitting layer EL is an organic light emitting layer, if the pixel circuit of a pixel applies a predetermined voltage to the pixel electrode AE and the common electrode CE receives a common voltage or a cathode voltage, holes may move to the light emitting layer EL through a hole transporting layer, and electrons may move to the light emitting layer EL through an electron transporting layer. Accordingly, the holes and the electrons may combine in the light emitting layer EL to emit light.

The common electrode CE may be located on the light emitting layer EL. For example, the common electrode CE may be implemented in the form of an electrode common to all pixels without distinction between the pixels. The common electrode CE may be located on the light emitting layers EL in the emission areas EA and may be located on the pixel defining layer PDL in an area other than the emission areas EA.

The pixel defining layer PDL may be located on the via layer VIA in the light blocking area BA. The pixel defining layer PDL may define a plurality of emission areas EA or a plurality of opening areas. The pixel defining layer PDL may separate and insulate the respective pixel electrodes AE of the pixels.

The encapsulation layer TFEL may be located on the common electrode CE to cover the light emitting elements ED. The encapsulation layer TFEL may include at least one inorganic layer to prevent or reduce oxygen, contaminants, or moisture from permeating into the light emitting elements ED. The encapsulation layer TFEL may include at least one organic layer to protect the light emitting elements ED from foreign substances such as dust.

The touch sensing unit TSU may be located on the encapsulation layer TFEL. The touch sensing unit TSU may include touch electrodes TE, a first insulating layer IL1, a bridge electrode BRG, and a second insulating layer IL2.

The touch electrodes TE may be located on the encapsulation layer TFEL in the light blocking area BA. The touch electrodes TE may sense a user's touch in a capacitive manner. For example, the touch sensing unit TSU may sense a user's touch using mutual capacitance formed between the touch electrodes TE or self-capacitance formed in each of the touch electrodes TE. Each of the touch electrodes TE may be formed as a single layer of molybdenum (Mo), titanium (Ti), copper (Cu), aluminum (Al) or indium tin oxide (ITO) or may be formed as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The first insulating layer IL1 may cover the touch electrodes TE and the encapsulation layer TFEL. The first insulating layer IL1 may have insulating and optical functions. For example, the first insulating layer IL1 may be an inorganic layer including at least one of a silicon nitride layer, a silicon oxynitride layer, a silicon oxide layer, a titanium oxide layer, or an aluminum oxide layer. For another example, the first insulating layer IL1 may include an organic layer.

The bridge electrode BRG may be located on the first insulating layer IL1. The bridge electrode BRG may be located on a different layer from the touch electrodes TE to electrically connect adjacent touch electrodes TE.

The second insulating layer IL2 may cover the bridge electrode BRG and the first insulating layer IL1. The second insulating layer IL2 may have insulating and optical functions. The second insulating layer IL2 may be made of the example materials of the first insulating layer IL1.

The polarizing film POL may be located on the second insulating layer IL2. The polarizing film POL may be attached onto the touch sensing unit TSU by an OCA film or an OCR. For example, the polarizing film POL may include a linear polarizer and a phase retardation film, and the phase retardation film may be a $\lambda/4$ plate. The phase retardation film and the linear polarizer may be sequentially stacked on the touch sensing unit TSU. The polarizing film POL may prevent or reduce color distortion caused by reflection of external light by reducing reflected light due to the external light.

The flexible film FPCB may be located under the substrate SUB. A first side of the flexible film FPCB may be inserted into the open portion SOP of the substrate SUB and electrically connected to the pad portion PAD, and a second side of the flexible film FPCB may be attached to the lower surface of the substrate SUB by an adhesive member ADM. The flexible film FPCB may include the lead electrode LDE located on an upper surface of the first side and inserted into the open portion SOP. The lead electrode LDE may protrude from the first side of the flexible film FPCB, and a portion of the lead electrode LDE may not overlap the flexible film FPCB.

An upper surface of the lead electrode LDE may directly contact a portion of the pad portion PAD, and a portion of a lower surface of the lead electrode LDE may be electrically connected to another portion of the pad portion PAD through the contact portion CTP. The flexible film FPCB may support the display driver DIC located on a lower surface of the second side. The lead electrode LDE may be electrically connected to the display driver DIC through a lead line located on a lower surface of the flexible film FPCB. The second side of the flexible film FPCB may be connected to a source circuit board under the substrate SUB. The flexible film FPCB may transmit signals and voltages of the display driver DIC to the display device 10. The flexible film FPCB may supply a scan control signal to the scan driver SIC.

The contact portion CTP may cover the lower surface of the lead electrode LDE protruding from the flexible film FPCB and a lower surface of the pad portion PAD exposed through the open portion SOP. The contact portion CTP may supplement electrical connection between the lead electrode LDE and the pad portion PAD and may stably fix the lead electrode LDE to the lower surface of the pad portion PAD. The contact portion CTP may include metal powder and a polymer. For example, the metal powder may include metal particles such as silver (Ag) and copper (Cu), and the polymer may include acrylic resin or epoxy resin, but embodiments according to the present disclosure are not limited thereto. The contact portion CTP may include the metal powder to have conductivity and may include the polymer as a binder that connects metal particles.

The contact portion CTP may be formed by printing a metal paste including metal particles, monomers and a solvent on the open portion SOP of the substrate SUB using a silicon pad and then sintering the metal paste using a laser. As the monomers are made to react to form polymers by heat from the laser during the sintering process, the metal particles may be brought into close contact with each other and agglomerated. Accordingly, the resistivity of the contact portion CTP may be lowered.

The display driver DIC may be mounted on the flexible film FPCB. The display driver DIC may be an integrated circuit. The display driver DIC may convert digital video data into analog data voltages based on a data control signal received from the timing controller and supply the analog data voltages to the data lines DL of the display area DA through the flexible film FPCB. The display driver DIC may supply a power supply voltage received from the power supply unit to the power lines VL of the display area DA through the flexible film FPCB. Because the display device 10 includes the fanout line FOL located on the substrate SUB and the flexible film FPCB and the display driver DIC located under the substrate SUB, the area of the non-display area NDA can be minimized or reduced.

Figure 6:
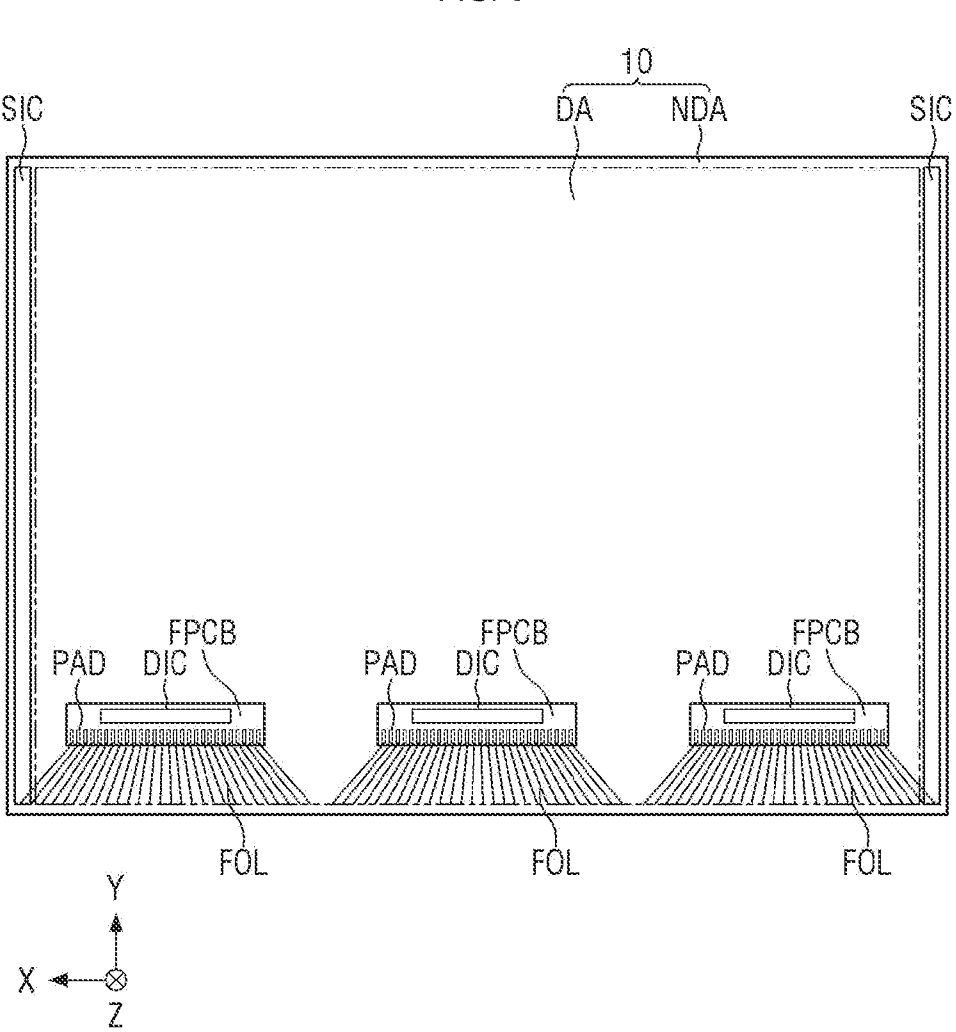
FIG. 6 is a bottom view of the display device according to some embodiments.
Figure 7:
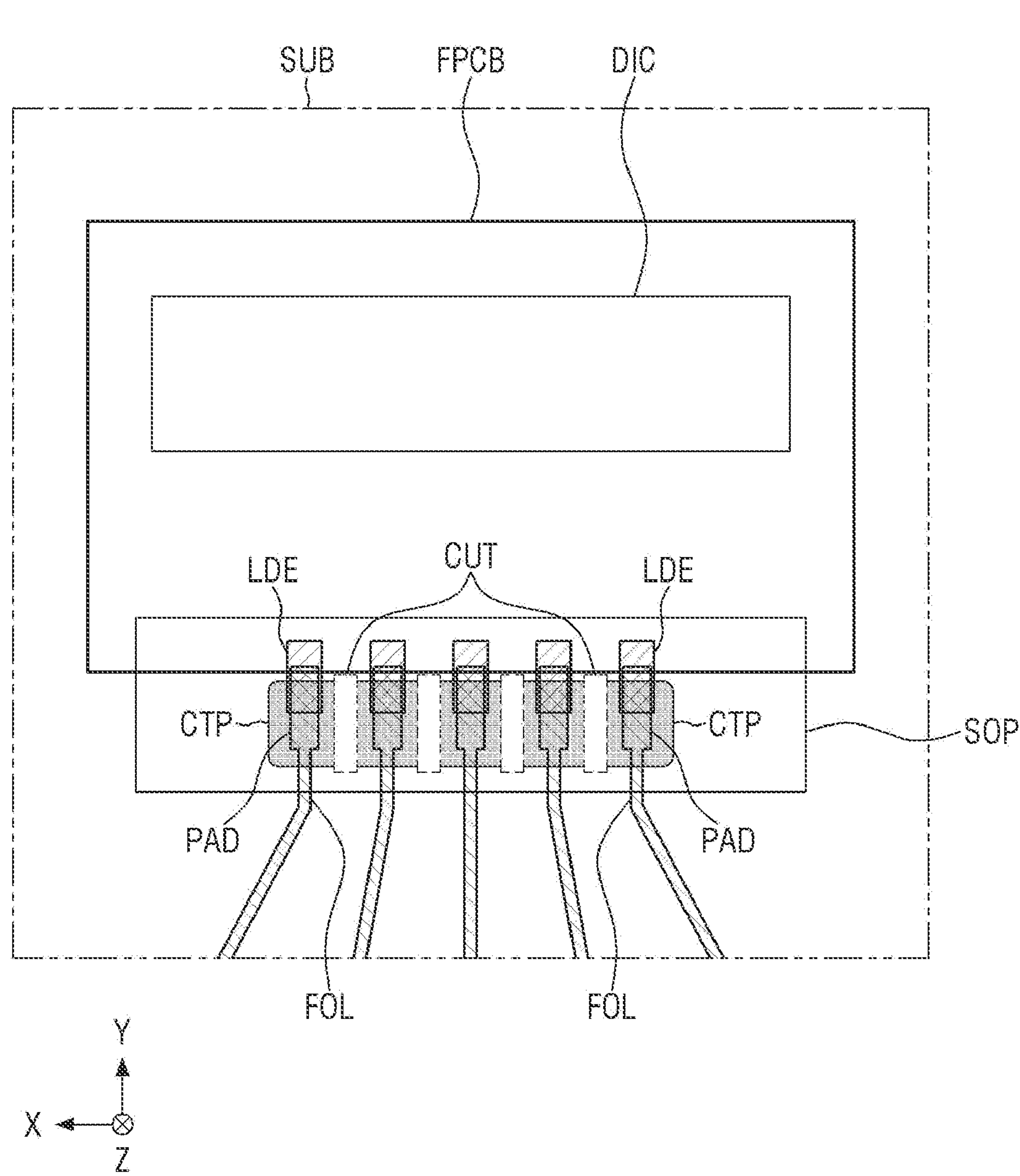
FIG. 7 is an enlarged bottom view of a portion of the display device according to some embodiments.

FIG. 6 is a bottom view of the display device 10 according to some embodiments. FIG. 7 is an enlarged bottom view of a portion of the display device 10 according to some embodiments.

Referring to FIGS. 6 and 7, flexible films FPCB, display drivers DIC, pad portions PAD, and fanout lines FOL may be located in the display area DA.

The fanout lines FOL may be integrally formed with the pad portions PAD. The fanout lines FOL may extend from the pad portions PAD to an edge of the display device 10. For example, the fanout lines FOL may extend from the flexible films FPCB toward a lower edge of the display device 10. The fanout lines FOL may be electrically connected to the data lines DL and the power lines VL of the display area DA or the scan driver SIC of the non-display area NDA through connection portions CWL.

The flexible films FPCB may be located under the substrate SUB. The flexible films FPCB may be located on an edge of a lower surface of the display device 10. The flexible films FPCB may supply data voltages, power supply voltages, and scan control signals, but embodiments according to the present disclosure are not limited thereto. The display drivers DIC may be mounted on the flexible films FPCB. The display drivers DIC may supply data voltages and power supply voltages to the display panel 100 through the flexible films FPCB.

The flexible films FPCB may be located under the substrate SUB. The first side of each of the flexible films FPCB may be inserted into an open portion SOP of the substrate SUB and thus electrically connected to the pad portions PAD, and the second side of each of the flexible films FPCB may be attached to the lower surface of the substrate SUB. Each of the flexible films FPCB may include lead electrodes LDE inserted into the open portion SOP. The lead electrodes LDE may protrude from the first side of each of the flexible films FPCB. A surface of each of the lead electrodes LDE may directly contact a portion of a pad portion PAD, and a portion of the other surface of each of the lead electrodes LDE may be electrically connected to another portion of the pad portion PAD through a contact portion CTP. The pad portions PAD may correspond to the lead electrodes LDE, respectively.

The contact portions CTP may cover the lower surfaces of the lead electrodes LDE and the lower surfaces of the pad portions PAD. The contact portions CTP may supplement electrical connection between the lead electrodes LDE and the pad portions PAD and may stably fix the lead electrodes LDE to the lower surfaces of the pad portions PAD. The contact portions CTP may include metal powder and a polymer. For example, the metal powder may include metal particles such as silver (Ag) and copper (Cu), and the polymer may include acrylic resin or epoxy resin, but embodiments according to the present disclosure are not limited thereto. The contact portions CTP may include the metal powder to have conductivity and may include the polymer as a binder that connects metal particles.

The contact portions CTP may be formed by printing a metal paste including metal particles, monomers and a solvent on the open portion SOP of the substrate SUB using a silicon pad and then sintering the metal paste using a laser. As the monomers are made to react to form polymers by heat from the laser during the sintering process, the metal particles may be brought into close contact with each other and agglomerated. Accordingly, the resistivity of the contact portions CTP may be lowered.

The sintered metal paste may cover all of the pad portions PAD and the lead electrodes LDE inserted into one open portion SOP at once, and a plurality of cut portions formed in a laser patterning process may separate the contact portions CTP. Each of the contact portions CTP may be separated from adjacent contact portions CTP by the cut portions CUT, and one contact portion CTP may electrically connect one pad portion PAD and one lead electrode LDE.

Figure 8:
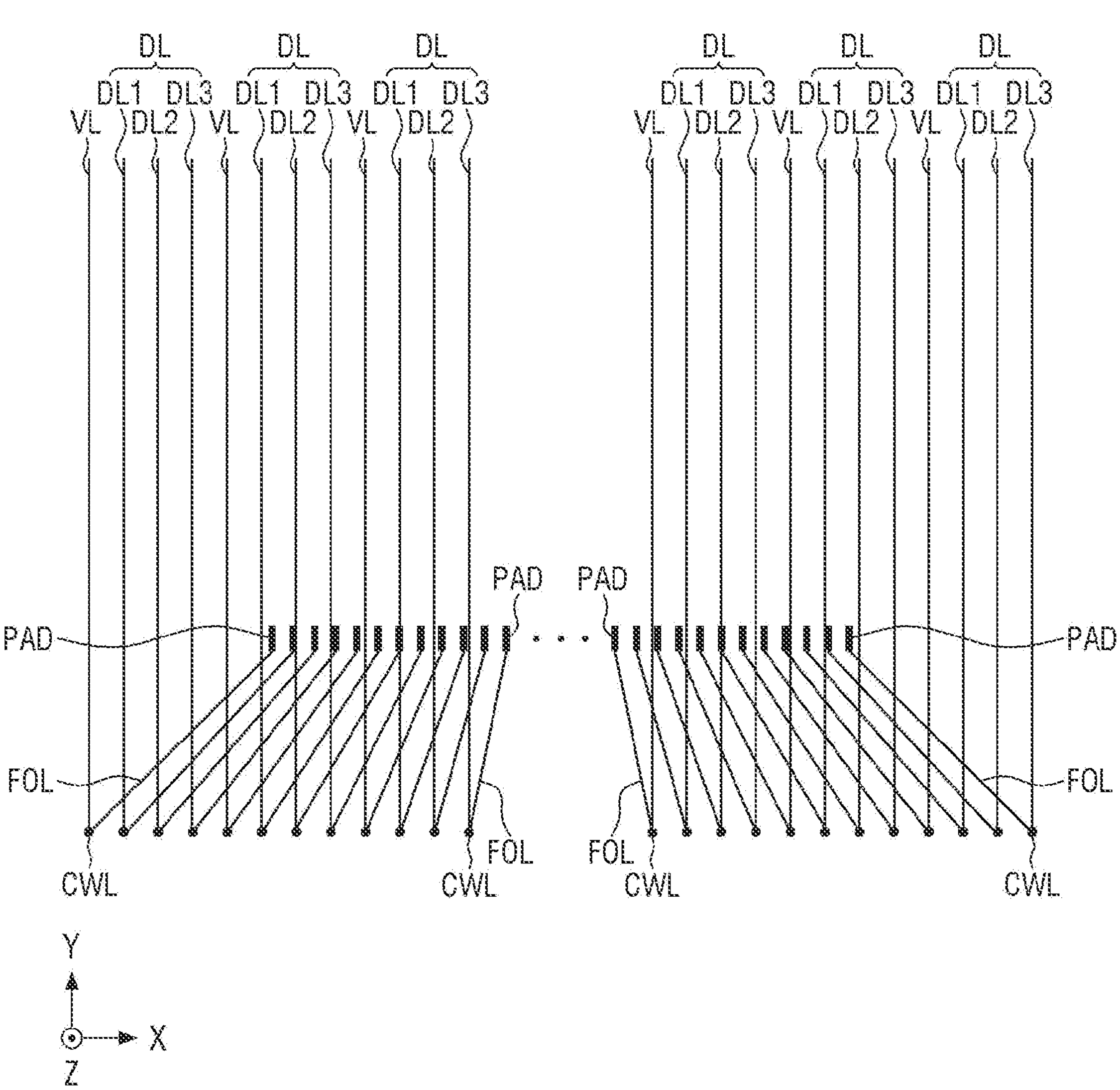
FIG. 8 illustrates pad portions, fanout lines, power lines, and data lines in the display device according to some embodiments.

FIG. 8 illustrates the pad portions PAD, the fanout lines FOL, the power lines VL, and the data lines DL in the display device 10 according to some embodiments.

Referring to FIG. 8, the display area DA may include the power lines VL and the data lines DL.

The power lines VL may extend in a second direction (Y-axis direction) and may be spaced apart from each other in a first direction (X-axis direction). Referring also to FIG. 4, the power lines VL may be located in the third metal layer MTL3 and may extend in the second direction (Y-axis direction). The power lines VL may be electrically connected to the fanout lines FOL of the first metal layer MTL1 through the connection portions CWL. The power lines VL may cross the fanout lines FOL in plan view. The power lines VL may receive a power supply voltage through the pad portions PAD. Here, the power supply voltage may be, but is not limited to, a high potential voltage, a low potential voltage, a driving voltage, an initialization voltage, a reference voltage, or a bias voltage.

The data lines DL may include first through third data lines DL1 through DL3. The first through third data lines DL1 through DL3 may extend in the second direction (Y-axis direction) and may be spaced apart from each other in the first direction (X-axis direction). The first through third data lines DL1 through DL3 may supply first through third data voltages to a plurality of pixels. Referring also to FIG. 4, the data lines DL may be located in the third metal layer MTL3 and may extend in the second direction (Y-axis direction). The data lines DL may be electrically connected to the fanout lines FOL of the first metal layer MTL1 through the connection portions CWL. The data lines DL may cross the fanout lines FOL in plan view. The data lines DL may receive data voltages through the pad portions PAD.

Figure 9:
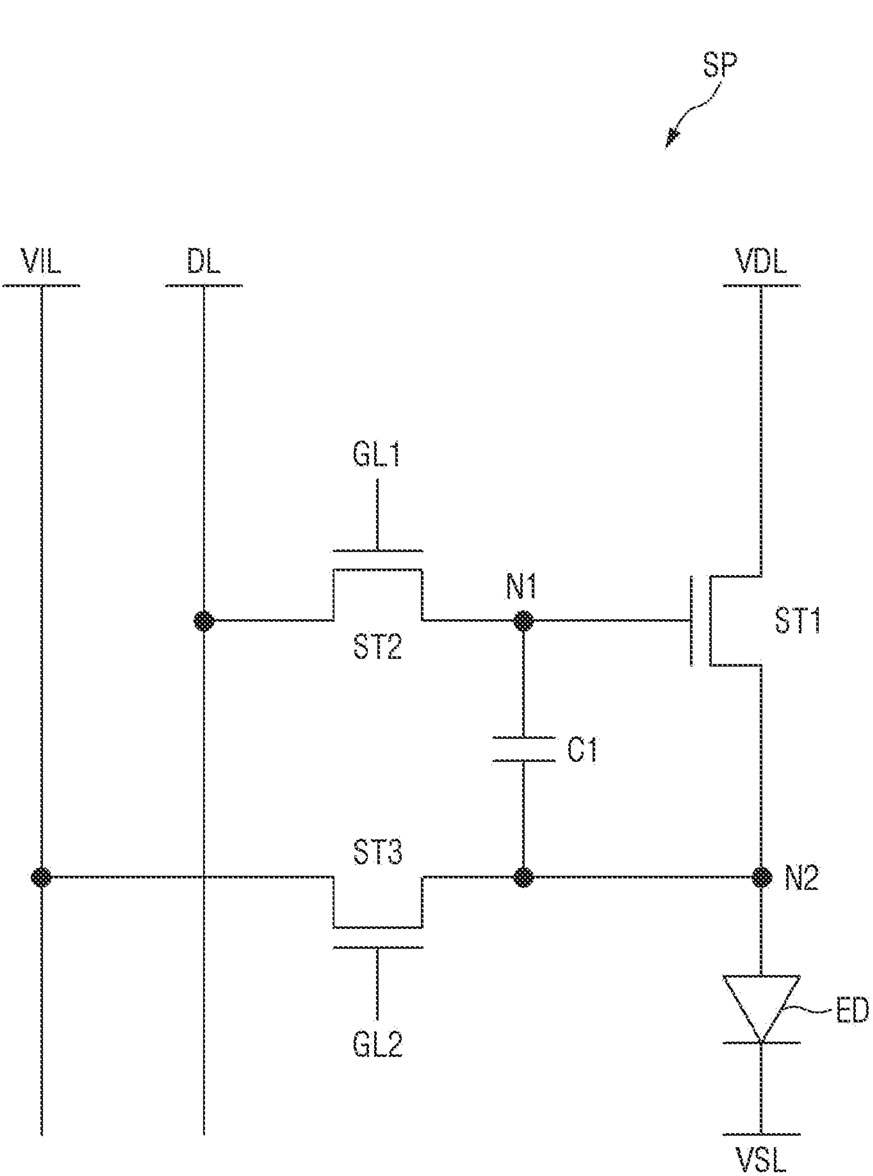
FIG. 9 is a circuit diagram of a pixel of the display device according to some embodiments.

FIG. 9 is a circuit diagram of a pixel SP of the display device 10 according to some embodiments.

Referring to FIG. 9, the pixel SP may include a pixel circuit and a light emitting element ED. The pixel circuit may include first through third transistors ST1 through ST3 and a first capacitor C1.

The first transistor ST1 may include a gate electrode, a drain electrode, and a source electrode. The first transistor ST1 may have the gate electrode connected to a first node N1, the drain electrode connected to a high potential line VDL, and the source electrode connected to a second node N2. The high potential line VDL may supply a high potential voltage to the first transistor ST1. The first transistor ST1 may control a drain-source current (or driving current) based on a data voltage applied to the gate electrode.

The pixel SP may include at least one light emitting element ED. When the pixel SP includes a plurality of light emitting elements ED, the light emitting elements ED may be connected in series or in parallel. The light emitting element ED may emit light in response to a driving current received from the first transistor ST1. The amount of light emitted from the light emitting element ED or the luminance of the light emitting element ED may be proportional to the magnitude of the driving current. The light emitting element ED may include an organic light emitting diode including an organic light emitting layer, a quantum dot light emitting diode including a quantum dot light emitting layer, an inorganic light emitting diode including an inorganic semiconductor, or a micro-light emitting diode.

A first electrode of the light emitting element ED may be connected to the second node N2, and a second electrode of the light emitting element ED may be connected to a low potential line VSL. The first electrode of the light emitting element ED may be connected to the source electrode of the first transistor ST1, a drain electrode of the third transistor ST3, and a second capacitor electrode of the first capacitor C1 through the second node N2. The low potential line VSL may supply a low potential voltage to the second electrode of the light emitting element ED.

The second transistor ST2 may be turned on by a first scan signal of a first scan line GL1 to electrically connect a data line DL and the first node N1 which is the gate electrode of the first transistor ST1. The second transistor ST2 may be turned on based on the first scan signal to supply a data voltage to the first node N1. The second transistor ST2 may have a gate electrode connected to the first scan line GL1, a drain electrode connected to the data line DL, and a source electrode connected to the first node N1.

The third transistor ST3 may be turned on by a second scan signal of a second scan line GL2 to electrically connect an initialization voltage line VIL and the second node N2 which is the source electrode of the first transistor ST1. The third transistor ST3 may be turned on based on the second scan signal to supply an initialization voltage to the second node N2 and a sensing signal to the initialization voltage line VIL. The third transistor ST3 may have a gate electrode connected to the second scan line GL2, the drain electrode connected to the second node N2, and a source electrode connected to the initialization voltage line VIL.

The first capacitor C1 may include a first capacitor electrode and the second capacitor electrode. The first capacitor electrode of the first capacitor C1 may be connected to the first node N1, and the second capacitor electrode of the first capacitor C1 may be connected to the second node N2. Therefore, the first capacitor C1 may maintain a potential difference between the gate electrode and the source electrode of the first transistor ST1.

FIGS. 10 through 13 are cross-sectional views illustrating a process of manufacturing a display device according to some embodiments. Hereinafter, a description of the same elements as those described above will be given briefly or omitted.

Figure 10:
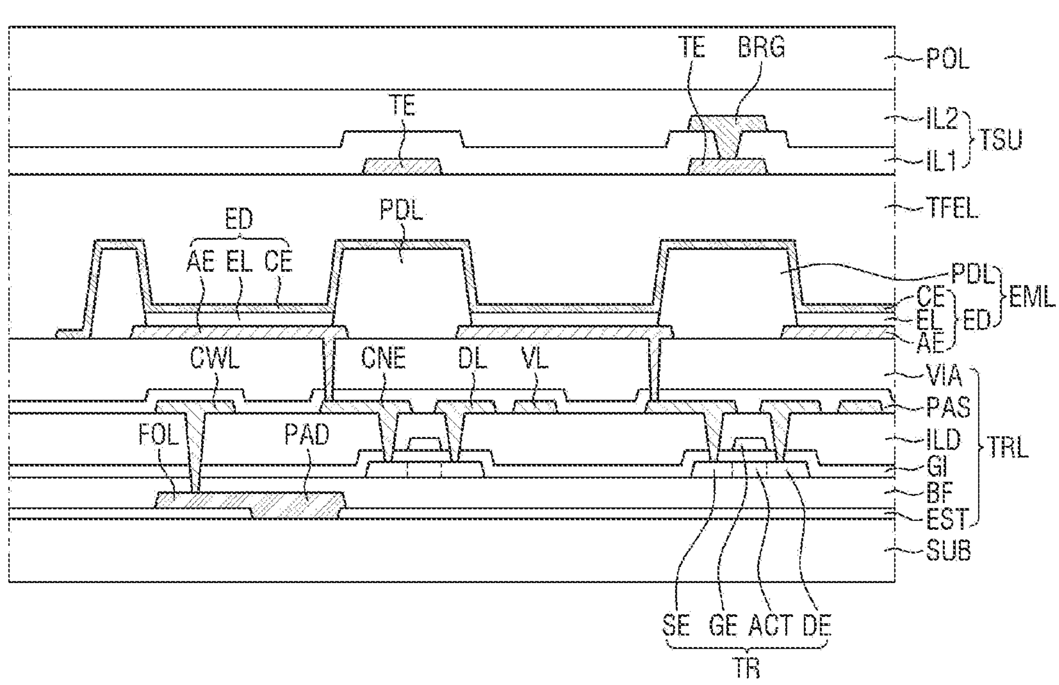

In FIG. 10, a substrate SUB may be a base substrate or a base member. For example, the substrate SUB may be a rigid substrate including a glass material or a metal material, but embodiments according to the present disclosure are not limited thereto. For another example, the substrate SUB may be a flexible substrate including polymer resin such as polyimide (PI).

A transistor layer TRL may be located on the substrate SUB. The transistor layer TRL may include an etch stop layer EST, a first metal layer MTL1, a buffer layer BF, an active layer ACTL, a gate insulating layer GI, a second metal layer MTL2, an interlayer insulating layer ILD, a third metal layer MTL3, a passivation layer PAS, and a via layer VIA.

A light emitting element layer EML may be located on the transistor layer TRL. The light emitting element layer EML may include light emitting elements ED and a pixel defining layer PDL.

An encapsulation layer TFEL may be located on a common electrode CE to cover the light emitting elements ED.

Figure 11:
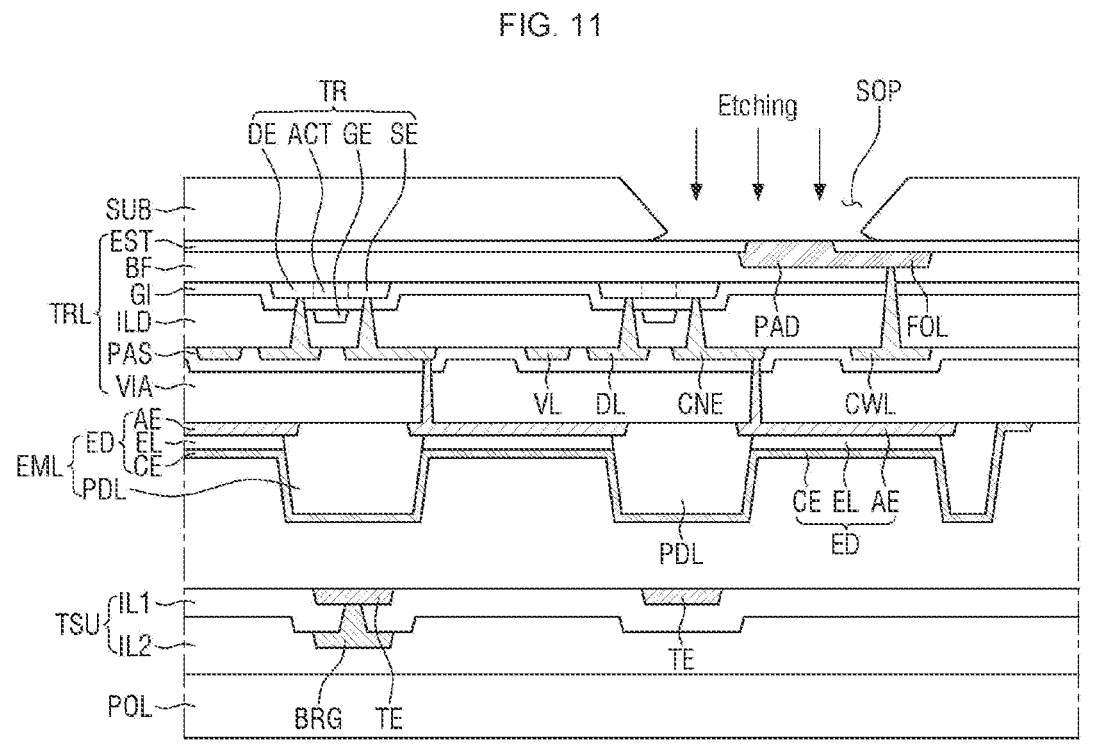

In FIG. 11, the display device 10 being manufactured may be turned upside down to attach a flexible film FPCB.

At least one of a wet etching process, a dry etching process, a plasma etching process, or a laser etching process may be performed on a surface of the substrate SUB. An open portion SOP may be provided in the substrate SUB to expose a portion of the etch stop layer EST and a pad portion PAD. The etch stop layer EST may protect the transistor layer TRL excluding the pad portion PAD in the etching process of the substrate SUB. Therefore, a fanout line FOL integrally formed with the pad portion PAD may be protected by the etch stop layer EST during the etching process of the substrate SUB.

Figure 12:
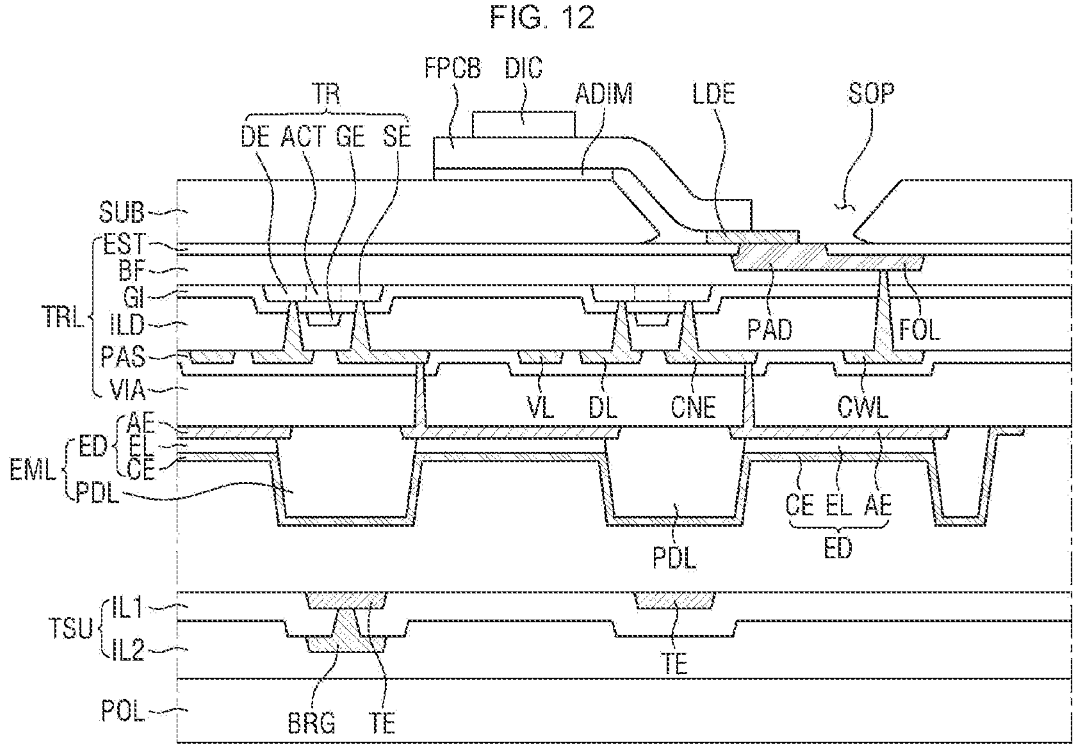

In FIG. 12, the flexible film FPCB may be placed on the surface of the substrate SUB. The flexible film FPCB and a lead electrode LDE may be aligned on the pad portion PAD through an alignment process. One side of the flexible film FPCB may be inserted into the open portion SOP of the substrate SUB and thus electrically connected to the pad portion PAD, and the other side of the flexible film FPCB may be attached to a lower surface of the substrate SUB by an adhesive member ADM. The lead electrode LDE may protrude from the one side of the flexible film FPCB. A surface of the lead electrode LDE may directly contact a portion of the pad portion PAD.

Figure 13:
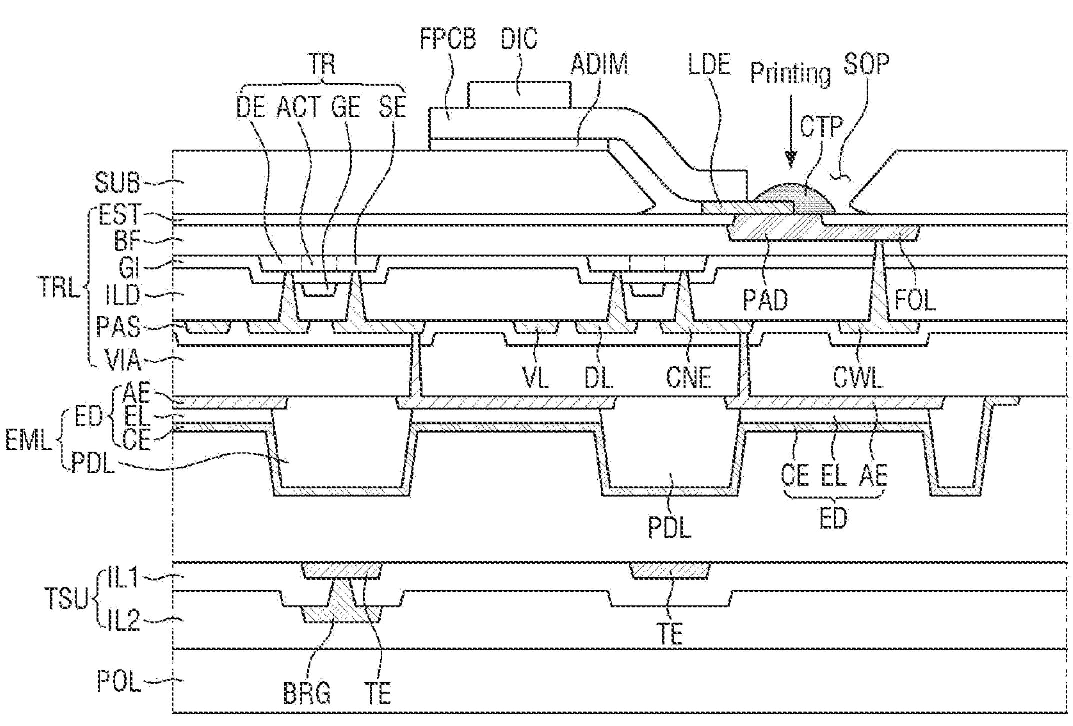

In FIG. 13, a contact portion CTP may cover a portion of the lead electrode LDE and a portion of the pad portion PAD. A portion of the other surface of the lead electrode LDE may be electrically connected to another portion of the pad portion PAD through the contact portion CTP. The contact portion CTP may supplement electrical connection between the lead electrode LDE and the pad portion PAD and may stably fix the lead electrode LDE to a surface of the pad portion PAD. The contact portion CTP may include metal powder and a polymer. For example, the metal powder may include metal particles such as silver (Ag) and copper (Cu), and the polymer may include acrylic resin or epoxy resin, but embodiments according to the present disclosure are not limited thereto. The contact portion CTP may include the metal powder to have conductivity and may include the polymer as a binder that connects metal particles.

The contact portion CTP may be formed by printing a metal paste including metal particles, monomers and a solvent on the open portion SOP of the substrate SUB using a silicon pad and then sintering the metal paste using a laser. As the monomers are made to react to form polymers by heat from the laser during the sintering process, the metal particles may be brought into close contact with each other and agglomerated. Accordingly, the resistivity of the contact portion CTP may be lowered.

The sintered metal paste may cover all of a plurality of pad portions PAD and a plurality of lead electrodes LDE inserted into one open portion SOP at once, and a plurality of cut portions CUT formed in a laser patterning process may separate a plurality of contact portions CTP. Each of the contact portions CTP may be separated from adjacent contact portions CTP by the cut portions CUT, and one contact portion CTP may electrically connect one pad portion PAD and one lead electrode LDE.

Therefore, in the display device 10, because the lead electrode LDE and the pad portion PAD are fixed to each other through the contact portion CTP, the lead electrode LDE of the flexible film FPCB can be electrically connected to the pad portion PAD without using ultrasonic bonding or thermocompression bonding. The contact portion CTP can easily connect the lead electrode LDE and the pad portion PAD by supplementing the electrical connection between the lead electrode LDE and the pad portion PAD. In addition, because the process of manufacturing the display device 10 is simplified, manufacturing time and manufacturing cost can be reduced.

In a display device and a method of manufacturing the same according to some embodiments, because a flexible film and a display driver are located under a substrate, the area of a non-display area can be relatively minimized or reduced. In addition, in the display device and the method of manufacturing the same, a lead electrode and a pad portion are fixed and electrically connected to each other through a contact portion using a metal paste. This may negate or reduce the need for ultrasonic bonding or thermocompression bonding and may relatively simplify the manufacturing process, thus reducing manufacturing time and cost.

However, the effects of the present disclosure are not restricted to those set forth herein. The above and other aspects of embodiments according to the present disclosure will become more apparent to one of daily skill in the art to which the present disclosure pertains by referencing the claims.

What is claimed is:

1. A display device comprising:

a substrate comprising an open portion;

a pad portion on the substrate and exposed through the open portion;

a fanout line integrally formed with the pad portion;

a data line electrically connected to the fanout line;

a flexible film under the substrate and comprising a lead electrode inserted into the open portion of the substrate to directly contact the pad portion; and a contact portion covering a lower surface of the lead electrode and a lower surface of the pad portion to electrically connect the lead electrode and the pad portion.

2. The display device of claim 1, wherein the lead electrode protrudes from a side of the flexible film, and the contact portion covers the lower surface of the lead electrode protruding from the flexible film.

3. The display device of claim 1, further comprising an etch stop layer between the substrate and the fanout line and exposing the pad portion to the open portion.

4. The display device of claim 3, wherein the etch stop layer includes at least one of polyimide (PI), silicon nitride (SiNx), or silicon (Si).

5. The display device of claim 1, wherein the substrate comprises:

a first side surface surrounding the open portion of the substrate and adjacent to a lower surface of the substrate; and a second side surface between the first side surface and an upper surface of the substrate.

6. The display device of claim 5, wherein the first side surface of the substrate is inclined at a range of 40 to 60 degrees to the lower surface of the substrate, and the second side surface of the substrate is inclined at less than 15 degrees to the upper surface of the substrate.

7. The display device of claim 5, wherein a planar length of the second side surface is smaller than a thickness of the substrate.

8. The display device of claim 1, wherein the contact portion is formed using a metal paste including silver (Ag) or copper (Cu).

9. The display device of claim 1, further comprising a display area configured to display an image and a non-display area surrounding the display area, wherein the pad portion and the flexible film are in the display area.

10. The display device of claim 1, further comprising:

a transistor layer comprising a transistor electrically connected to the data line;

a light emitting element layer on the transistor layer and comprising a light emitting element; and an encapsulation layer covering upper and side surfaces of the light emitting element layer.

11. The display device of claim 1, further comprising:

a transistor layer comprising a transistor electrically connected to the data line;

a light emitting element layer on the transistor layer and comprising a light emitting element;

an encapsulation substrate on the light emitting element layer; and a sealing portion provided between the substrate and the encapsulation substrate along edges of the substrate and the encapsulation substrate to bond the substrate and the encapsulation substrate together.

12. A display device comprising:

a substrate comprising an open portion;

an etch stop layer on the substrate and comprising a contact hole overlapping the open portion;

a pad portion on the etch stop layer and inserted into the contact hole of the etch stop layer;

a fanout line integrally formed with the pad portion;

a transistor electrically connected to the fanout line;

a flexible film under the substrate and inserted into the open portion of the substrate; and a lead electrode comprising a portion, which protrudes from a side of the flexible film and does not overlap the flexible film, and directly contacting the pad portion.

13. The display device of claim 12, further comprising a contact portion covering the portion of the lead electrode, which does not overlap the flexible film, and a surface of the pad portion to electrically connect the lead electrode and the pad portion.

14. The display device of claim 13, wherein the contact portion is formed using a metal paste including silver (Ag) or copper (Cu).

15. The display device of claim 12, wherein the substrate comprises:

a first side surface surrounding the open portion of the substrate and adjacent to a lower surface of the substrate; and a second side surface between the first side surface and an upper surface of the substrate.

16. The display device of claim 15, wherein the first side surface of the substrate is inclined at a range of 40 to 60 degrees to the lower surface of the substrate, and the second side surface of the substrate is inclined at less than 15 degrees to the upper surface of the substrate.

17. A method of manufacturing a display device, the method comprising:

providing a substrate;

forming an etch stop layer, which comprises a contact hole, on the substrate;

forming a pad portion which is inserted into the contact hole of the etch stop layer;

forming a fanout line integrally with the pad portion and on the etch stop layer;

forming an open portion to expose the pad portion by etching a lower portion of the substrate;

bringing a lead electrode of a flexible film into direct contact with the pad portion by inserting a side of the flexible film into the open portion; and forming a contact portion which electrically connects the pad portion and the lead electrode by covering a portion of the pad portion and a portion of the lead electrode.

18. The method of claim 17, wherein the forming of the contact portion comprises printing a metal paste on the open portion of the substrate and sintering the metal paste.

19. The method of claim 18, wherein the forming of the contact portion further comprises separating the sintered metal paste into a plurality of contact portions through a laser patterning process.

20. The method of claim 17, wherein the forming of the open portion of the substrate comprises:

forming a first side surface which surrounds the open portion of the substrate and is adjacent to a lower surface of the substrate; and forming a second side surface between the first side surface and an upper surface of the substrate by undercutting the first side surface.

* * * * *